(12) United States Patent
Furuhata

(10) Patent No.: US 9,012,312 B2
(45) Date of Patent: Apr. 21, 2015

(54) SEMICONDUCTOR DEVICE MANUFACTURING METHOD

(71) Applicant: Seiko Epson Corporation, Tokyo (JP)

(72) Inventor: Tomoyuki Furuhata, Suwa (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 14/196,654

(22) Filed: Mar. 4, 2014

(65) Prior Publication Data

US 2014/0287573 A1  Sep. 25, 2014

(30) Foreign Application Priority Data

Mar. 25, 2013 (JP) .................................. 2013-062056

(51) Int. Cl.
| | | |
|---|---|---|
| H01L 21/425 | (2006.01) | |
| H01L 21/265 | (2006.01) | |
| H01L 21/761 | (2006.01) | |
| H01L 21/74  | (2006.01) | |
| H01L 21/8234| (2006.01) | |
| H01L 29/732 | (2006.01) | |

(52) U.S. Cl.
CPC ............ *H01L 21/265* (2013.01); *H01L 21/761* (2013.01); *H01L 21/74* (2013.01); *H01L 21/823481* (2013.01); *H01L 29/7322* (2013.01)

(58) Field of Classification Search
CPC ... H01L 21/761; H01L 21/74; H01L 21/8249; H01L 21/823481; H01L 29/7322; H01L 29/0821; H01L 29/66712

USPC ......... 438/526, 542, 363, 358, 356, 419, 420; 257/E21.544

See application file for complete search history.

(56) References Cited

U.S. PATENT DOCUMENTS

| | | | |
|---|---|---|---|
| 5,556,796 A  * | 9/1996  | Garnett et al. ................. 438/294 |
| 5,925,910 A    | 7/1999  | Menegoli |
| 6,133,107 A    | 10/2000 | Menegoli |
| 6,784,489 B1   | 8/2004  | Menegoli |
| 7,619,299 B2 * | 11/2009 | Mita et al. ..................... 257/565 |
| 7,910,449 B2 * | 3/2011  | Soma et al. .................... 438/363 |
| 2003/0001210 A1* | 1/2003 | Rittaku ......................... 257/351 |
| 2013/0187256 A1* | 7/2013 | Shirai ........................... 257/565 |

FOREIGN PATENT DOCUMENTS

JP   A-10-284731   10/1998

\* cited by examiner

*Primary Examiner* — Michael Trinh
(74) *Attorney, Agent, or Firm* — Oliff PLC

(57) ABSTRACT

A semiconductor device manufacturing method includes (a) forming a buried diffusion layer of a first conductivity type in a semiconductor substrate of a second conductivity type, (b) forming a first impurity region by implanting an impurity of the first conductivity type, (c) diffusing the buried diffusion layer and the first impurity region to an extent that the buried diffusion layer and the first impurity region are not connected by performing a first thermal process on the semiconductor substrate, (d) forming a second impurity region by implanting an impurity of the first conductivity type at a concentration higher than that of in step (b), and (e) diffusing the buried diffusion layer, the first impurity region, and the second impurity region by performing a second thermal process on the semiconductor substrate.

5 Claims, 4 Drawing Sheets

(D)

(E)

(F)

(G)

(H)

SEMICONDUCTOR DEVICE MANUFACTURING METHOD

The entire disclosure of Japanese Patent Application No. 2013-062056, filed Mar. 25, 2013 is expressly incorporated by reference herein.

BACKGROUND

1. Technical Field

The present invention relates to a semiconductor device manufacturing method.

2. Related Art

In order to manufacture DMOS (Double Diffused Metal Oxide Semiconductor) transistors or bipolar transistors, a first impurity region that is connected to a buried diffusion layer and a second impurity region that is connected to the buried diffusion layer are formed. For example, a bottom of a well (first impurity region) in which DMOS transistors or bipolar transistors are formed is limited by a buried diffusion layer, and an outer circumference of the well is limited by plugs (second impurity region). In this structure, reduction of an element area is a problem to be solved.

JP-A-10-284731 (FIGS. 7 to 10 and paragraphs 0021 to 0023) describes a situation in which, in order to form a drain region, impurity ions are implanted and diffused to a buried region using thermal drive-in technology, and then the drain region expands along a face of a substrate by a thermal process performed in a field oxide forming step, or the like.

As shown in JP-A-10-284731 (FIGS. 7 to 10 and paragraphs 0021 to 0023), if the drain region expands in the direction along the face of the substrate by a thermal process after impurity ions in the drain region are diffused to the buried region, an element area is enlarged by the amount of this enlargement.

SUMMARY

An advantage of some aspects of the invention is to enable reduction of an element area, in a case where a first impurity region that is connected to a buried diffusion layer and a second impurity region that is connected to the buried diffusion layer are formed.

In some aspects of the invention, a semiconductor device manufacturing method includes (a) forming a first buried diffusion layer of a first conductivity type that contains an impurity of the first conductivity type inside a semiconductor substrate of a second conductivity type; (b) forming a first impurity region by implanting an impurity of the first conductivity type at a first location of a first face of the semiconductor substrate; (c) diffusing the first buried diffusion layer and the first impurity region, by performing a first thermal process on the semiconductor substrate, at least in the thickness direction of the semiconductor substrate to an extent that the first buried diffusion layer and the first impurity region are not connected; (d) forming a second impurity region by implanting an impurity of the first conductivity type at a second location of the first face at a higher concentration than that of step (b); and (e) diffusing the first buried diffusion layer, the first impurity region, and the second impurity region, by performing a second thermal process on the semiconductor substrate, at least in the thickness direction of the semiconductor substrate such that the first buried diffusion layer and the first impurity region are connected to each other, and the first buried diffusion layer and the second impurity region are connected to each other.

According to the above-described aspect, prior to implanting an impurity of the second impurity region, the first buried diffusion layer and the first impurity region are diffused by the first thermal process in the thickness direction of the semiconductor substrate to an extent that the first buried diffusion layer and the first impurity region are not connected. Thereafter, impurities of the second impurity region is implanted, and the first buried diffusion layer, the first impurity region, and the second impurity region are diffused by the second thermal process. Thus, the element area can be reduced due to suppressing expansion of the second impurity region by reducing the thermal process time of the second impurity region.

In the aforementioned aspect, it is desirable that step (e) includes, further, diffusing the first impurity region and the second impurity region also in the direction along the first face of the semiconductor substrate such that the first impurity region and the second impurity region are connected to each other.

Accordingly, all the region surrounded by the second impurity region can be the first impurity region.

In the aforementioned aspect, it is desirable that step (a) further includes forming a second buried diffusion layer of the second conductivity type that contains an impurity of the second conductivity type inside the semiconductor substrate of the second conductivity type at at least a portion of a region that surrounds the first buried diffusion layer in a plan view on the first face, and the semiconductor device manufacturing method further includes (f) implanting, after step (d), an impurity of the second conductivity type at a third location on the first face where it overlaps with the second buried diffusion layer in a plan view on the first face.

Accordingly, elements are reliably isolated.

In the aforementioned aspect, it is desirable that the second conductivity-type impurity contained in the second buried diffusion layer and the second conductivity-type impurity that is implanted in step (f) includes an ion of an element whose atomic weight is smaller than that of the first conductivity-type impurity contained in the first buried diffusion layer, that of the first conductivity-type impurity that is implanted in step (b), and that of the first conductivity-type impurity that is implanted in step (d).

Accordingly, the impurity of the second conductivity type is more diffusible than the impurity of the first conductivity type. In diffusing the impurity of the second conductivity type, after the second thermal process for diffusing the first conductivity-type second impurity region, and the like, further diffusion of the first conductivity-type second impurity region can be suppressed.

In the aforementioned aspect, step (a) may form the first buried diffusion layer by forming a third impurity region by implanting an impurity of the first conductivity type to the second conductivity-type semiconductor substrate, and thereafter forming an epitaxial layer of the second conductivity type on the third impurity region.

DESCRIPTION OF EXEMPLARY EMBODIMENTS

The following is a detailed description of embodiments of the invention. Note that the embodiments described below are not intended to unduly limit the content of the invention recited in the claims, and all of the configurations described in the embodiments are not necessarily essential as solutions provided by the invention. Also, similar constituent elements are provided the same reference sign, and redundant description thereof will be omitted.

1. Configuration

Figure 1:
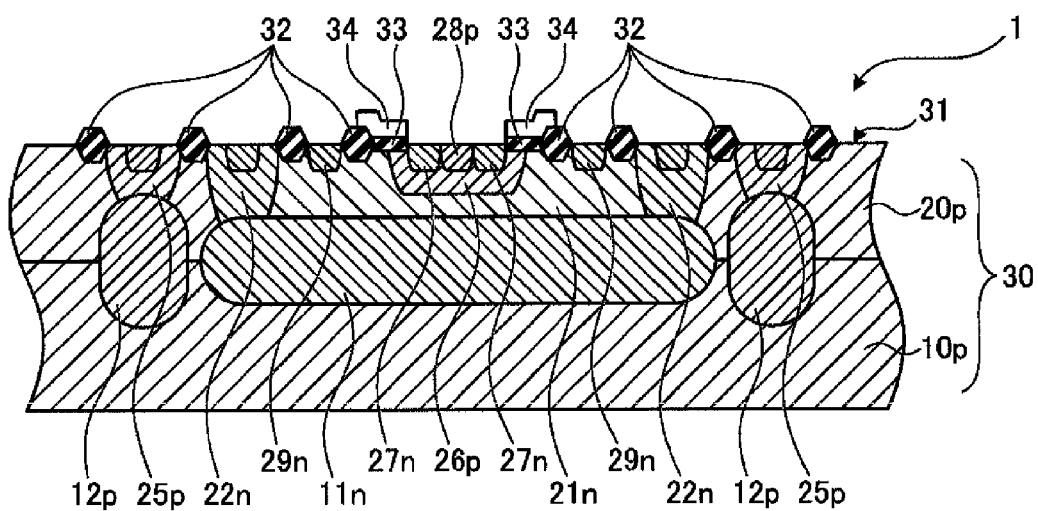
FIG. 1 is a cross-section showing an example of a semiconductor device manufactured by the manufacturing method according to an embodiment.

FIG. 1 is a cross-section showing an example of a semiconductor device manufactured by the manufacturing method according to an embodiment of the present invention. A semiconductor device 1 shown in FIG. 1 includes a first buried diffusion layer 11n, a first impurity region 21n, a second impurity region 22n, a second buried diffusion layer 12p, and a fifth impurity region 25p in a semiconductor substrate 30 that has a base layer 10p and an epitaxial layer 20p. In the description of this embodiment, reference symbols of portions of the semiconductor device 1 are appended a letter "n" or "p" according to the conductivity type thereof. In this embodiment, although the n-type corresponds to a first conductivity type and the p-type corresponds to a second conductivity type, the n-type and the p-type may be reversed.

The base layer 10p of the semiconductor substrate 30 is made of single-crystal silicon that contains impurities of the second conductivity type. The epitaxial layer 20p of the semiconductor substrate 30 is made of silicon formed on one of the faces of the base layer 10p by epitaxial growth. The epitaxial layer 20p also contains impurities of the second conductivity type. The epitaxial layer 20p, for example, contains boron (B) as the impurity at a concentration of $2\times10^{14}$–$2\times10^{15}$/cm$^3$, and the resistivity and the film thickness thereof are 5-25 Ω·cm and 3-10 μm, respectively.

The first buried diffusion layer 11n is located across the interface between the base layer 10p and the epitaxial layer 20p, and contains impurities of the first conductivity type (such as antimony (Sb)) at a concentration of $1$–$5\times10^{19}$/cm$^3$, for example.

The first impurity region 21n is located in the epitaxial layer 20p in a region where it overlaps with the first buried diffusion layer 11n in a plan view, and contains impurities of the first conductivity type (such as phosphorus (P)) at a concentration of $5\times10^{15}$–$5\times10^{16}$/cm$^3$, for example. One end of the first impurity region 21n is in contact with the first buried diffusion layer 11n and the other end thereof extends to the first face 31 of the semiconductor substrate 30. Note that, in the present embodiment, "plan view" is a view seen from the direction perpendicular to the first face 31. The first face 31 corresponds to the upper face of the epitaxial layer 20p. "Up" refers to the direction from the base layer 10p to the epitaxial layer 20p along the thickness direction of the semiconductor substrate 30.

The second impurity region 22n is located in the epitaxial layer 20p in a region where it encloses the first impurity region 21n in a plan view, and contains impurities of the first conductivity type at a high concentration. One end of the second impurity region 22n is in contact with the first buried diffusion layer 11n and the other end thereof extends to the first face 31 of the semiconductor substrate 30.

The second buried diffusion layer 12p is located across the interface between the base layer 10p and the epitaxial layer 20p at a position where it surrounds the first buried diffusion layer 11n in a plan view, and contains impurities of the second conductivity type (such as boron (B)) at a concentration of $1\times10^{16}$–$1\times10^{17}$/cm$^3$, for example.

The fifth impurity region 25p is located in the epitaxial layer 20p in a region where it overlaps with the second buried diffusion layer 12p in a plan view, and contains impurities of the second conductivity type (such as boron (B)) at a concentration of $1\times10^{16}$–$5\times10^{17}$/cm$^3$, for example. One end of the fifth impurity region 25p is in contact with the second buried diffusion layer 12p and the other end thereof extends to the first face 31 of the semiconductor substrate 30.

The first impurity region 21n that contains a relatively low concentration of the first conductivity-type impurities can function as a well in which semiconductor devices 1 such as DMOS transistors are formed. The first impurity region 21n is isolated from the base layer 10p by the first buried diffusion layer 11n in the thickness direction of the semiconductor substrate 30. The first impurity region 21n is isolated from other semiconductor elements (not shown) by, in the direction along the first face 31 of the semiconductor substrate 30, the first conductivity-type second impurity region 22n and the second conductivity-type second buried diffusion layer 12p and fifth impurity region 25p.

The semiconductor device 1 formed in the first impurity region 21n may include, for example, a body region 26p located around the center of the first impurity region 21n, a source region 27n and a body contact region 28p that are located near the center of the body region 26p, a plurality of gate insulator films 33 located above both ends of the body region 26p, a plurality of gate electrode 34 located on the plurality of gate insulator films 33, and a plurality of drain regions 29n located near both ends of the first impurity region 21n. In the body region 26p under the gate insulator films 33, channels that can cause conduction between the source regions 27n and the drain regions 29n according to the voltage applied to the gate electrodes 34 are formed.

On the first face 31 of the semiconductor substrate 30, insulator films 32 are formed between the gate insulator film 33 and the drain region 29n, between the drain region 29n and the second impurity region 22n, between the second impurity region 22n and the fifth impurity region 25p, and outside of the fifth impurity region 25p.

2. Manufacturing Method

Figure 2:
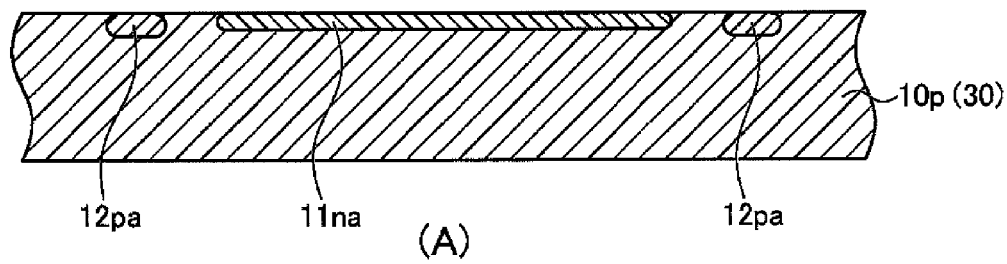
FIG. 2 is a cross-section showing the semiconductor device manufacturing method according to an embodiment.
Figure 2:
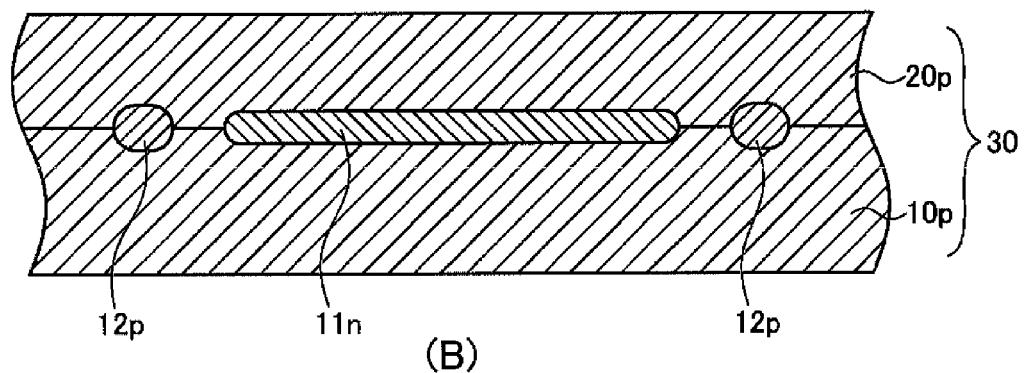
Figure 2:
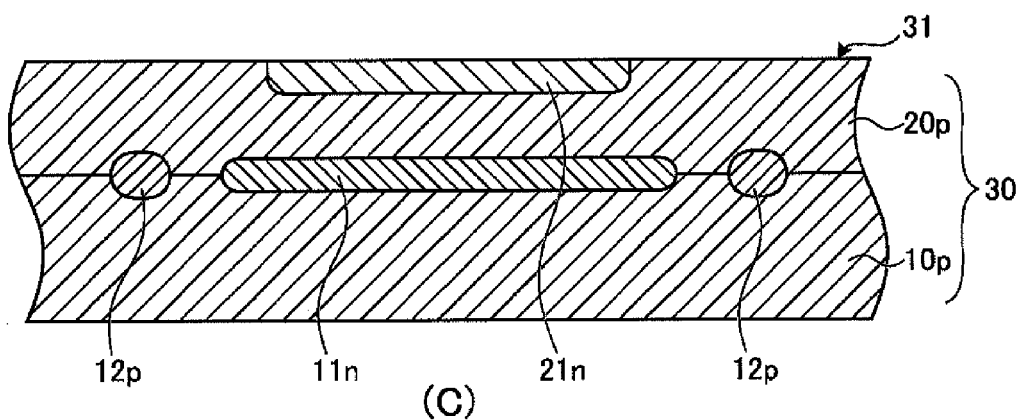
Figure 3:
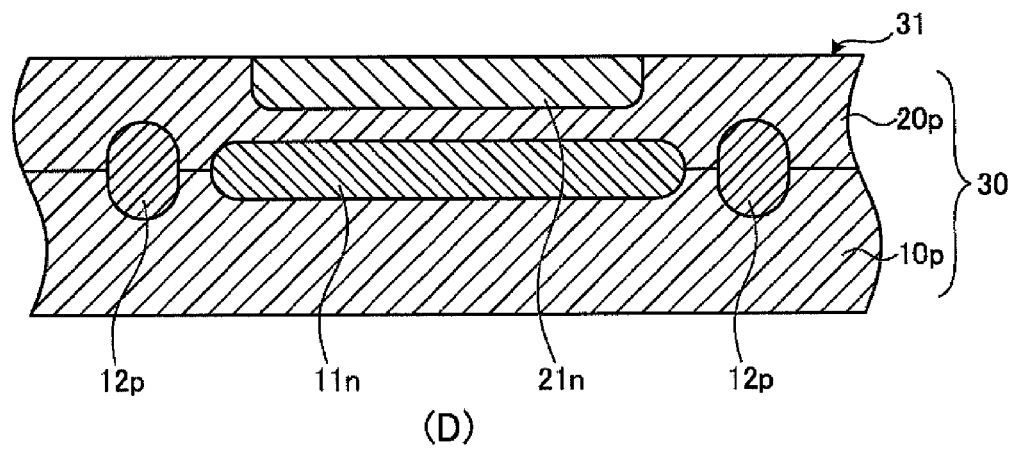
FIG. 3 is a cross-section showing the semiconductor device manufacturing method according to an embodiment.
Figure 3:
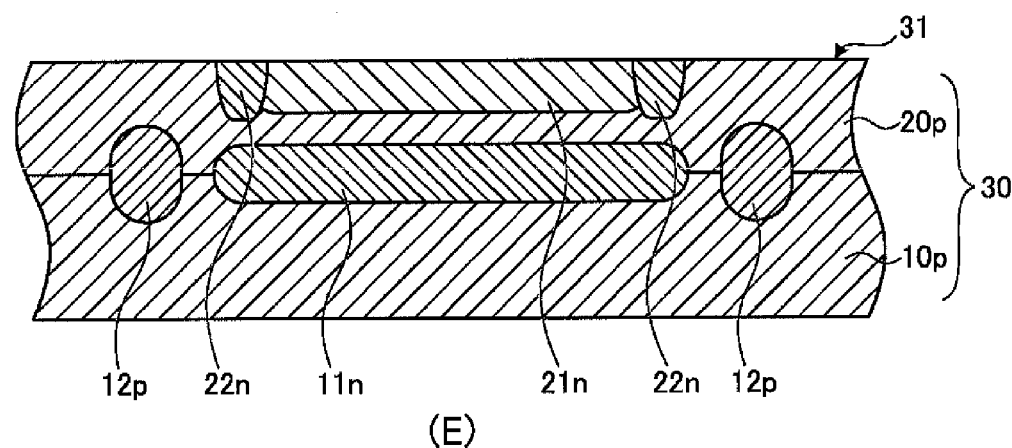
Figure 3:
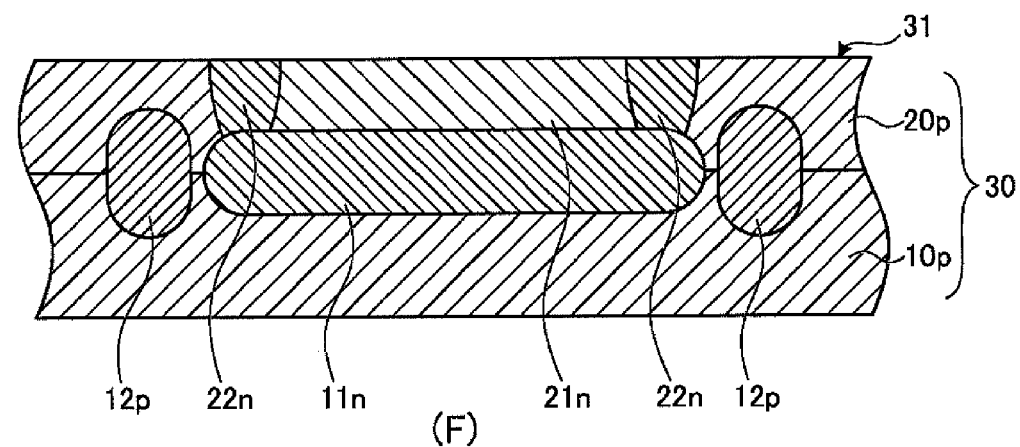
Figure 4:
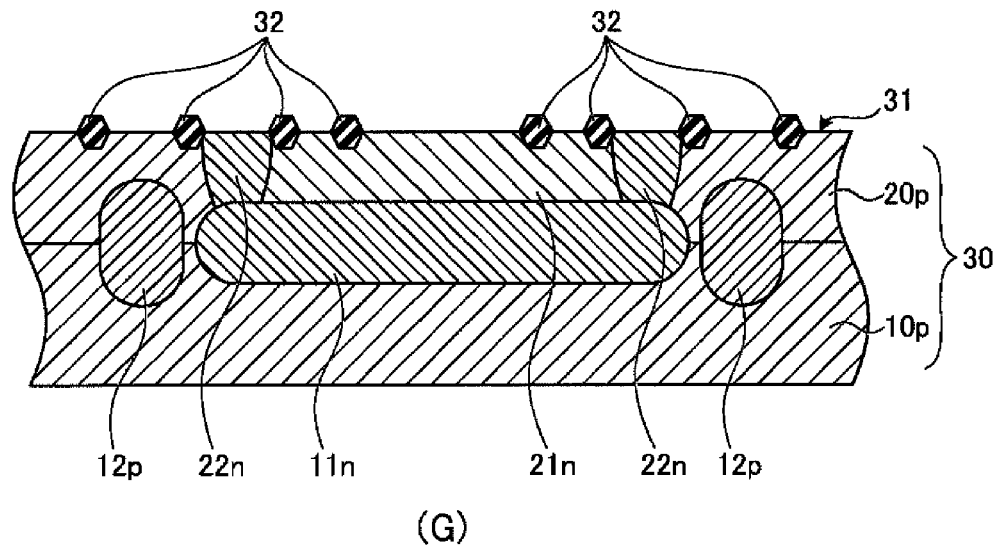
FIG. 4 is a cross-section showing the semiconductor device manufacturing method according to an embodiment.
Figure 4:
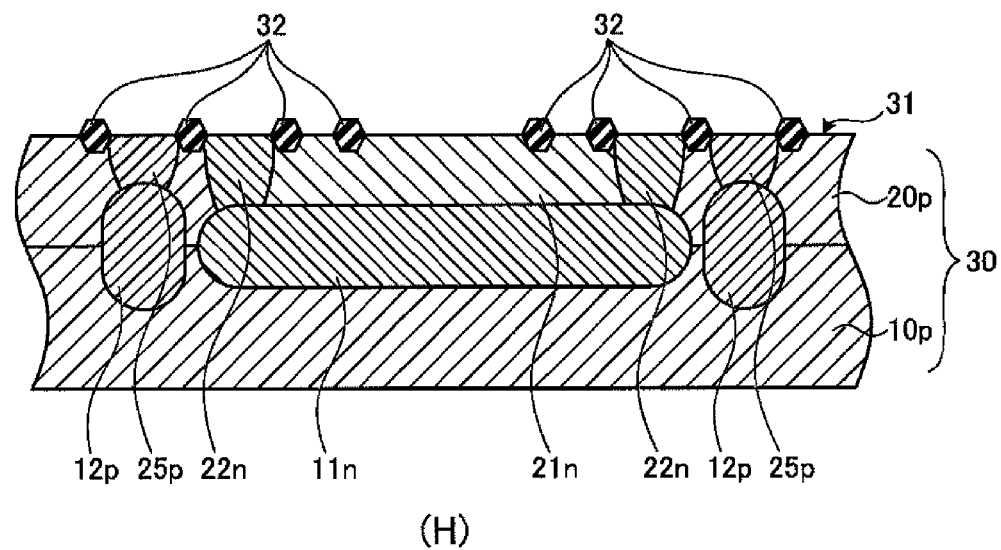

FIGS. 2 to 4 are cross-sections of the semiconductor device manufacturing method according to the embodiment of the invention. First, as shown in FIG. 2A, a third impurity region 11na is formed on the second conductivity-type base layer 10p of the semiconductor substrate 30 by implanting impurities of the first conductivity type (antimony ion, acceleration voltage of 30-60 KeV, at a dose of $1$–$5\times10^{15}$/cm$^2$, for example) and performing thermal diffusion (1100-1200° C., 3-5 hours, for example), and fourth impurity regions 12pa are formed by implanting impurities of the second conductivity type (boron ion, acceleration voltage of 40-100 KeV, at a dose of $1\times10^{13}$–$2\times10^{14}$/cm$^2$, for example).

Next, the epitaxial layer 20p is formed, as shown in FIG. 2B, on the base layer 10p on which the third impurity region 11na and the fourth impurity regions 12pa are formed. The epitaxial layer 20p contains, for example, boron (B) as the impurity at a concentration of $2\times10^{14}$–$2\times10^{15}$/cm$^3$, and the resistivity and the film thickness thereof are 5-25 Ω·cm and 3-10 μm, respectively. The base layer 10p and the epitaxial layer 20p constitute the second conductivity-type semiconductor substrate 30. Some of the impurities contained in the third impurity region 11na and the fourth impurity region 12pa that are shown in FIG. 2A diffuse into the epitaxial layer 20p, as shown in FIG. 2B. Thus, the first buried diffusion layer 11n and the second buried diffusion layer 12p are formed inside the semiconductor substrate 30.

Next, as shown in FIG. 2C, the first impurity region 21n is formed by implanting impurities of the first conductivity type (phosphorus ion, acceleration voltage of 2-3 MeV, at a dose of $1\times10^{13}$–$5\times10^{13}$/cm$^2$, for example) on the first face 31 of the semiconductor substrate 30. The first impurity region 21n is formed in the region where it overlaps with the first buried diffusion layer 11n in a plan view on the first face 31. The concentration of the first impurity region 21n is relatively low.

Next, as shown in FIG. 3D, the first buried diffusion layer 11n, the first impurity region 21n, and the second buried diffusion layer 12p are diffused by performing a first thermal process (1100° C., 3-10 hours, for example) on the semiconductor substrate 30. In the first thermal process, the first buried diffusion layer 11n and the first impurity region 21n are diffused in the thickness direction of the semiconductor substrate 30 to an extent that the first buried diffusion layer 11n and the first impurity region 21n are not connected.

Next, as shown in FIG. 3E, the second impurity region 22n is formed by implanting impurities of the first conductivity type (phosphorus ions, acceleration voltage of 60-120 eV, at a dose of $5\times10^{14}$–$5\times10^{15}$/cm$^2$, for example) on the first face 31 of the semiconductor substrate 30 in a region where it surrounds the first impurity region 21n. At this time, the first impurity region 21n and the second impurity region 22n may be connected, or not be connected.

Next, as shown in FIG. 3F, the first buried diffusion layer 11n, the first impurity region 21n, the second impurity region 22n, and the second buried diffusion layer 12p are diffused by performing a second thermal process (1000-1100° C., 1-7 hours, for example) on the semiconductor substrate 30. Due to the second thermal process, the first buried diffusion layer 11n, the first impurity region 21n, and the second impurity region 22n are diffused in the thickness direction of the semiconductor substrate 30 such that the first buried diffusion layer 11n and the first impurity region 21n are connected, and the first buried diffusion layer 11n and the second impurity region 22n are connected.

Moreover, in a case where the first impurity region 21n and the second impurity region 22n are not connected in the step shown in FIG. 3E, the first impurity region 21n and the second impurity region 22n are diffused in the direction along the first face 31 of the semiconductor substrate 30 such that the first impurity region 21n and the second impurity region 22n are connected by the second thermal process.

Next, as shown in FIG. 4G, the insulator films 32 are formed on predetermined locations of the first face 31 of the semiconductor substrate 30 by the LOCOS (Local Oxidization of Silicon) method, for example. The insulator films 32 are not limited to films formed by the LOCOS method, and may be element isolation insulator films formed by the STI (Shallow Trench Isolation) method.

Next, as shown in FIG. 4H, the fifth impurity regions 25p are formed by implanting impurities of the second conductivity type (boron ions, acceleration voltage of 80-600 KeV, at a dose of $5\times10^{12}$–$5\times10^{13}$/cm$^2$, for example) on the first face 31 of the semiconductor substrate 30. The fifth impurity region 25p is formed in a region where it overlaps with the second buried diffusion layer 12p in a plan view on the first face 31.

The semiconductor device 1 can be manufactured by forming the body region 26p, the source region 27n, the body contact region 28p, and the drain region 29n, the gate insulator film 33, the gate electrode 34, and the like thereafter, as shown in FIG. 1, for example.

In the aforementioned manufacturing step, the second impurity region 22n is diffused so as to be connected with the first buried diffusion layer 11n in a relatively short thermal process time, since the impurities are contained therein at a high concentration. On the other hand, the first impurity region 21n requires long thermal processing so as to be connected with the first buried diffusion layer 11n, since the impurities are contained therein at a relatively low concentration.

In a case where the first impurity region 21n and the second impurity region 22n are diffused to the first buried diffusion layer 11n in one thermal process, since a long period of time is required to diffuse the first impurity region 21n, the second impurity region 22n diffuses in the direction along the first face 31 more than necessary. In this case, the element area is enlarged at an amount of expansion of the second impurity region 22n.

According to the present embodiment, prior to the implantation of the impurities to the second impurity region 22n, the first buried diffusion layer 11n and the first impurity region 21n are diffused in the thickness direction of the semiconductor substrate 30 to an extent that the first buried diffusion layer 11n and the first impurity region 21n are not connected by the first thermal process. Thereafter, the impurities are implanted to the second impurity region 22n, and the first buried diffusion layer 11n, the first impurity region 21n, and the second impurity region 22n are diffused by the second thermal process. Thus, the reduction of the element area becomes possible due to suppressing the expansion of the second impurity region 22n by reducing the thermal processing time of the second impurity region 22n.

Moreover, according to the present embodiment, compared with a case in which the first buried diffusion layer 11n and the first impurity region 21n are connected by the first thermal process, and thereafter the second thermal process is performed to diffuse the second impurity region 22n, time required for the first thermal process can be shortened since the first thermal process is performed to an extent that the first buried diffusion layer 11n and the first impurity region 21n are not connected. As the result, the total time of the first thermal process and the second thermal process can be shortened.

It is desirable that the second conductivity-type impurity to form the second buried diffusion layer 12p and the fifth impurity region 25p is an ion of an element that has smaller atomic weight than that of the first conductivity-type impurity to form the first buried diffusion layer 11n, the first impurity region 21n, and the second impurity region 22n. Thus, the second conductivity-type impurity can be more diffusible than the first conductivity-type impurity. For example, a phosphorus (P) or arsenic (As) ion is used as the first conductivity-type impurity, and a boron (B) ion is used as the second conductivity-type impurity. Further diffusion of the first conductivity-type second impurity region 22n can be suppressed even though a step to diffuse the second conductivity-type impurity is performed after the second thermal process to diffuse the first conductivity-type second impurity region 22n, and the like.

What is claimed is:
1. A semiconductor device manufacturing method comprising:
   (a) forming a first buried diffusion layer of a first conductivity type that contains an impurity of the first conductivity type inside a semiconductor substrate of a second conductivity type;

(b) forming a first impurity region by implanting an impurity of the first conductivity type at a first location of a first face of the semiconductor substrate;

(c) diffusing the first buried diffusion layer and the first impurity region, by performing a first thermal process on the semiconductor substrate, at least in the thickness direction of the semiconductor substrate to an extent that the first buried diffusion layer and the first impurity region are not connected;

(d) forming a second impurity region by implanting an impurity of the first conductivity type at a second location of the first face at a higher concentration than that of step (b); and (e) diffusing the first buried diffusion layer, the first impurity region, and the second impurity region, by performing a second thermal process on the semiconductor substrate, at least in the thickness direction of the semiconductor substrate such that the first buried diffusion layer and the first impurity region are connected to each other, and the first buried diffusion layer and the second impurity region are connected to each other.

2. The semiconductor device manufacturing method according to claim 1, wherein step (e) includes, further, diffusing the first impurity region and the second impurity region also in the direction along the first face of the semiconductor substrate such that the first impurity region and the second impurity region are connected to each other.

3. The semiconductor device manufacturing method according to claim 1, wherein step (a) further includes forming a second buried diffusion layer of the second conductivity type that contains an impurity of the second conductivity type inside the semiconductor substrate of the second conductivity type at least a portion of a region that surrounds the first buried diffusion layer in a plan view on the first face, and the semiconductor device manufacturing method further includes:

(f) implanting, after step (d), an impurity of the second conductivity type at a third location on the first face where it overlaps with the second buried diffusion layer in a plan view on the first face.

4. The semiconductor device manufacturing method according to claim 1, wherein the second conductivity-type impurity contained in the second buried diffusion layer and the second conductivity-type impurity that is implanted in step (f) includes an ion of an element whose atomic weight is smaller than that of the first conductivity-type impurity contained in the first buried diffusion layer, that of the first conductivity-type impurity that is implanted in step (b), and that of the first conductivity-type impurity that is implanted in step (d).

5. The semiconductor device manufacturing method according to claim 1, wherein step (a) forms the first buried diffusion layer by forming a third impurity region by implanting an impurity of the first conductivity type to the second conductivity-type semiconductor substrate, and thereafter forming an epitaxial layer of the second conductivity type on the third impurity region.

* * * * *